United States Patent [19]
Liu

[11] 3,882,420
[45] May 6, 1975

[54] MAGNETICALLY TUNABLE FERRITE STRIPLINE TRAPATT MODE OSCILLATOR AND AMPLIFIER CIRCUITS

[75] Inventor: Shing-Gong Liu, Princeton, N.J.

[73] Assignee: RCA Corporation, New York, N.Y.

[22] Filed: May 24, 1974

[21] Appl. No.: 473,210

[52] U.S. Cl. ........................ 331/99; 330/5; 330/34; 330/53; 330/61 A; 331/107 R; 331/177 R; 333/84 M

[51] Int. Cl. ........ H03b 3/04; H03b 7/14; H03f 3/10

[58] Field of Search ........ 331/96, 99, 107 R, 177 R; 330/5, 34, 53, 61 A; 333/84 M

[56] References Cited

UNITED STATES PATENTS

| | | | |
|---|---|---|---|
| 3,668,554 | 6/1972 | Dupre | 331/107 R |
| 3,743,967 | 7/1973 | Fitzsimmons et al. | 330/5 X |
| 3,753,153 | 8/1973 | Liu et al. | 331/107 R |
| 3,766,494 | 10/1973 | Anbe et al. | 331/99 |

*Primary Examiner*—Siegfried H. Grimm
*Attorney, Agent, or Firm*—Edward J. Norton; Joseph D. Lazar; Michael A. Lechter

[57] ABSTRACT

An active element for generating signals in a Trapatt mode at a desired frequency is included in a transmission line circuit on a ferrite substrate. The transmission line circuit has a first magnetically tunable portion determining the desired frequency of operation and a second portion having an automatic magnetically tunable impedance for operating the element in the Trapatt mode.

7 Claims, 3 Drawing Figures

MAGNETICALLY TUNABLE FERRITE STRIPLINE TRAPPATT MODE OSCILLATOR AND AMPLIFIER CIRCUITS

BACKGROUND OF THE INVENTION

1. Field of the Invention

This invention relates to apparatus having an avalanche diode operating in the Trapatt mode for generating microwave signals, and more particularly, to apparatus being frequency tunable in response to a D.C. magnetic field.

2. Description of the Prior Art

The operating frequency of prior art apparatus such as microwave oscillators or amplifiers having an avalanche diode operating in the Trapatt mode for generating microwave signals is tuned by arranging an appropriate microwave circuit to include mechanically operated microwave devices such as transmission line stretchers or mechanically variable capacitors. It is often desirable to vary electrically oscillator or amplifier output signal frequency. It is known in the prior art that electrically variable capacitors, such as varactor diodes, change the resonance of a tuned circuit in response to a suitable reverse bias voltage and thereby, the operating frequency of certain negative resistance semiconductor devices. It is also known in the prior art that an oscillator having a frequency determining resonant length of transmission line conductor on a ferrite substrate is tunable in response to a suitable D.C. magnetic field coupled to the ferrite substrate. However, in the Trapatt mode of avalanche diode operation, oscillator or amplifier operating frequency is partially determined by the impedance presented by a suitable microwave circuit and the phase of harmonically related signals reflected by the microwave circuit. Thus, a change in resonance of a tuned circuit or a change in the electrical length of a frequency determining transmission line conductor does not provide conditions suitable for efficiently frequency tuning an avalanche diode operating in the Trapatt mode.

SUMMARY OF THE INVENTION

An active element having at least two input terminals and exhibiting a current-voltage characteristic including a negative resistance portion for causing the active element to operate in a Trapatt mode in response to a bias signal exceeding a predetermined threshold magnitude generates signals at a desired frequency during periods when the bias signal exceeds the predetermined threshold magnitude when the active element is included in a transmission line circuit on a ferrite substrate. The transmission line circuit has a first magnetically tunable portion determining the desired frequency and a second portion having a magnetically tunable impedance for operating the element in the Trapatt mode.

DESCRIPTION OF THE PREFERRED EMBODIMENT

An avalanche diode is a two terminal semiconductor device exhibiting a negative resistance current-voltage characteristic in response to an appropriate reverse bias signal applied across the diode terminals. An avalanche diode of the type capable of operating in a high efficiency or Trapped Plasma Avalanche Transit Time (Trapatt) mode has a complex impedance comprising substantially a negative resistance and capacitive reactance. The reverse bias signal establishes a displacement current or electric field in the depletion layer of the diode's semiconductive material. The magnitude of the depletion layer electric field is sufficient to ionize diode carriers when the magnitude of the reverse bias signal exceeds the diode breakdown voltage $V_B$. Carrier density is increased as the moving ionized carriers collide with other atoms creating additional carriers. The previously referred to displacement current can also be considered a wavefront moving with specific wave velocity, provided the rise time of the displacement current is relatively fast. If the wave velocity of the displacement current is greater than the saturation velocity of the carriers, a high density of holes and electrons will be left in the wake of the displacement current wavefront. As a result of the concentration of holes and electrons, the depletion layer electric field is reduced and the velocity of the carriers is diminished, leading to the formation of a dense trapped plasma. Microwave signals at a fundamental frequency and frequencies harmonically related to the fundamental frequency are generated by an avalanche diode operating in the Trapatt mode by establishing boundary conditions leading to the formation of the dense trapped plasma.

A boundary condition for forming a dense trapped plasma is a diode depletion layer displacement current with a relatively fast rise time. A method for providing a relatively fast rise time displacement current is to include the avalanche diode in a microwave circuit arranged to reflect harmonically related high frequency signals generated by the diode in response to carrier ionization at relatively low current levels. Such a microwave circuit is arranged to have a frequency passband including the desired frequency of diode operation and a frequency stop-band for reflecting signals at all other frequencies back to the diode. In addition to providing a conductive path for signals at the desired frequency of operation and reflecting diode generated signals at harmonically related frequencies, the microwave circuit is arranged to match the frequency dependent complex impedance of the avalanche diode to the impedance of a terminating load. An example of a microwave circuit having a frequency pass-band at the fundamental frequency of diode operation and a frequency stop-band for diode generated signals harmonically related to the fundamental frequency is a low-pass filter.

Figure 1:
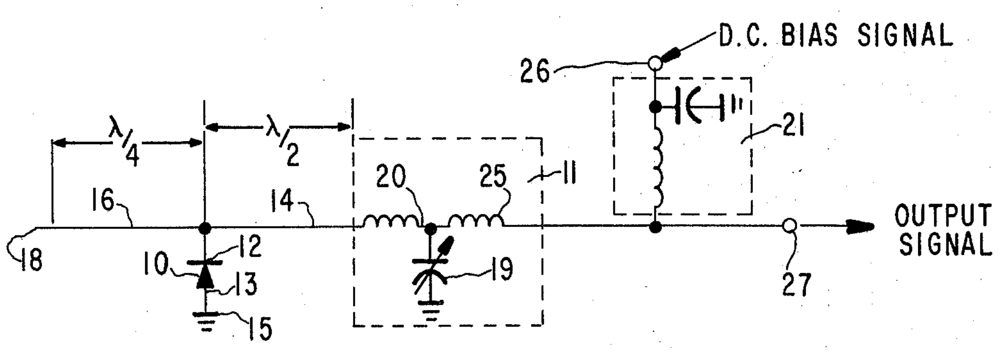
(PRIOR ART) FIG. 1
FIG. 1 is a schematic of a prior art circuit having an avalanche diode operative in the Trapatt mode.

Referring to FIG. 1, there is shown a schematic of an avalanche diode 10 coupled to a prior art low-pass filter 11 having capacitive element 19 and inductive elements 20 and 25 arranged to provide a conductive path to terminal 27 for signals at the desired operating frequency and a frequency stop-band for reflecting diode generated signals necessary for the Trapatt mode of avalanche diode operation. Cathode terminal 12 and anode terminal 13 of diode 10 are respectively connected between transmission line center conductor 14 and ground potential 15. Center conductor 16 is arranged to have one end connected to terminal 12 and the other end 18 open circuited. Center conductor 16 is used to provide a relatively low impedance at terminals 12 and 13 at the desired frequency of diode operation when the electrical length of center conductor 16 is substantially $\gamma/4$, where $\gamma$ is the transmission line wavelength at the desired frequency of operation. The desired frequency of avalanche diode 10 operation is determined by the ratio of the depletion layer width of diode 10 to the velocity of the carriers in the plasma and the phase of the diode generated signals reflected by low-pass filter 11. It is believed that the phase of the reflected signals is optimum when the electrical length of center conductor 14 between diode terminal 12 and the reflection plane of filter 11 is substantially $\gamma/2$, where $\gamma$ is the transmission line wavelength at the desired frequeny of operation.

A reverse D.C. bias voltage, from a source not shown, is coupled to diode 10 via terminal 26 of a suitable low-pass filter 21 arranged, as known in the art, to provide a relatively low impedance path for D.C. signals and a relatively high impedance at microwave frequencies. As previously explained, diode 10 is triggered into operation when the magnitude of the reverse D.C. bias signal exceeds a predetermined threshold magnitude or diode breakdown voltage $V_B$. It is also known in the prior art that diode 10 is triggered into operation by a combination of a reverse D.C. bias voltage having a magnitude not exceeding breakdown voltage, $V_B$, and a microwave signal coupled to diode 10 from a source, not shown, provided the combination has a magnitude exceeding diode breakdown voltage $V_B$.

The operating frequency of diode 10 is varied from frequency $f_1$ to $f_2$ in response to a change in the electrical length of center conductor 14 from $\gamma_1/2$ to $\gamma_2/2$ where $\gamma_1$ is the transmission line wavelength at frequency $f_1$ and $\gamma_2$ is the transmission line wavelength at frequency $f_2$. In the prior art, mechanical or manually operated devices such as a transmission line stretcher, not shown, is used to vary the electrical length of center conductor 14. However, in addition to varying the electrical length of center conductor 14, filter 11 must be tuned to provide an impedance suitable for the Trapatt mode of avalanche diode 10 operation at frequency $f_2$. Thus, filter 11 includes at least one manually tunable capacitive filter element 19 for filter 11 impedance tuning. Mechanical or manual tuning devices for varying the output frequency of a signal generated by an avalanche diode operating in the Trapatt mode are sometimes inconvenient. In certain applications it is desirable to vary electrically the output frequency of a signal generated by an avalanche diode 10 operating in the Trapatt mode without the need of mechanical adjustment.

Figure 2:
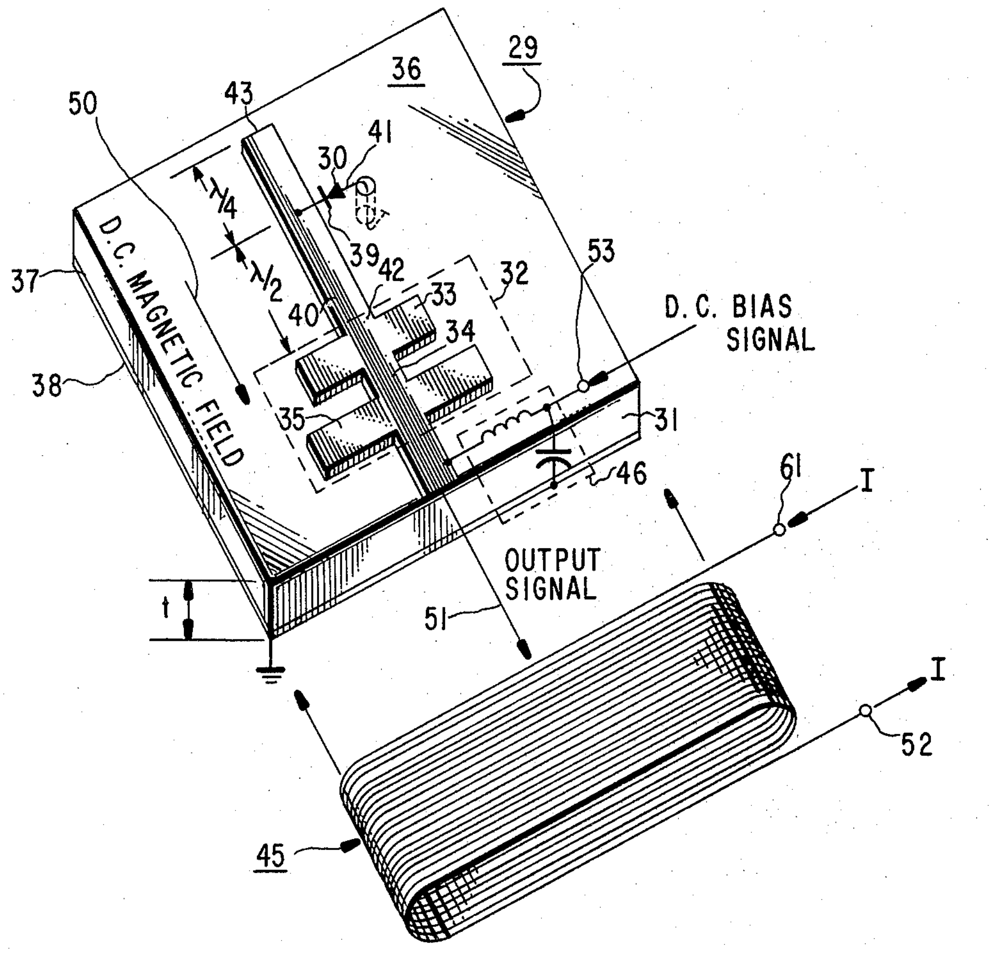
FIG. 2 is an exploded isometric view of a frequency tunable microstrip transmission line oscillator according to the invention.

Referring to FIG. 2, there is shown an exploded isometric view of a frequency tunable microstrip transmission line oscillator 29 having an avalanche diode 30 capable of operating in the Trapatt mode according to one embodiment of the invention. Unlike prior art microstrip transmission line oscillators having a dielectric transmission line substrate material, such as alumina ($Al_2O_3$), Transmission line substrate 31 is formed of a ferrite material, such as yttrium iron garnet, having a magnitude of magnetic permeability, $\mu$, susceptable or responsive to a change in magnitude, H, of a longitudinal D.C. magnetic field applied in the direction of microwave signal propagation, represented by arrow 51. The direction of the D.C. magnetic field is represented by arrow 50.

A microwave circuit suitable for operating avalanche diode 30 in the Trapatt mode comprises a microstrip transmission line low-pass filter 32, formed by a combination of several strip-like conductors 33, 34 and 35 on the top surface 36 of ferrite substrate 31. The bottom surface 37 of ferrite substrate 31 is metal clad 38 to form a planar conductor at reference or ground potential. Conductive strip-like elements 33, 34 and 35 of low-pass filter 32 are arranged, as known in the art, to provide a reflective plane or stop-band for the relatively high frequency diode generated signals necessary for Trapatt mode of avalanche diode 30 operation. In addition, the elements 33, 34 and 35 of low-pass filter 32 are arranged to provide an impedance suitable for optimizing diode 30 performance at the lowest tunable output signal frequency of oscillator 29 operation.

Cathode electrode 39 of diode 30 is connected to strip-like conductor 40 between open circuited end 43 and end 42 suitably joined to conductor 33. Anode electrode 41 of diode 30 is connected to ground conductor 38 by a through-hole in substrate 31. The electrical length of conductor 40 from cathode electrode 39 to the reflection plane of low-pass filter 32 is substantially $\gamma/2$, where $\gamma$ is the microstrip transmission line wavelength at the lowest output signal frequency of oscillator 29 operation.

Strip-like conductor 40 is arranged to provide a relatively low microwave impedance across diode 30 terminals 39 and 41 when the electrical length between end 43 and cathode 39 is substantially $\gamma/4$, where $\gamma$ is the microstrip transmission line wavelength at the lowest output signal frequency of oscillator 29 operation.

The operating frequency of oscillator 29 is varied over a frequency bandwidth in response to a variable magnitude longitudinal D.C. magnetic field coupled to or induced in ferrite substrate 31 in the desired direction of microwave signal propagation. By way of example and not limitation, means for coupling a D.C. magnetic field to ferrite substrate 31 include a suitable winding 45 surrounding substrate 31. A longitudinal D.C. magnetic field is induced in substrate 31 in response to current, I, from a source, not shown, coupled to the end 61 of winding 45. A suitable permanent magnet or electromagnet may also be used for coupling a D.C. magnetic field to substrate 31. The magnitude of magnetic permeability, $\mu$, of substrate 31 is responsive to changes in the magnitude of the coupled D.C. magnetic field which is in turn determined by the magnitude of current I. Thus, since transmission line wavelength, $\gamma$, is prooportional to the variable magnitude of the magnetic permeability, $\mu$, of substrate 31, the frequency determining electrical length, $\gamma/2$, between cathode electrode 39 and the reflection plane of low-pass filter 32 and oscillator operating frequency is determined by the magnitude of the coupled D.C. magnetic field. An increase in the magnitude of the applied D.C. magnetic field decreases the magnitude of transmission line wavelength from $\gamma_1$ to $\gamma_2$ thereby increasing oscillator output signal frequency from $f_1$ to $f_2$. In addition to increasing the oscillator frequency from $f_1$ to $f_2$, the variable magnitude of the D.C. magnetic field produces a change in the impedance magnitude of low-pass filter 32 suitable for efficient diode 30 operation in the Trapatt mode at frequency $f_2$.

Means for coupling a reverse D.C. bias signal having a magnitude exceeding diode 30 breakdown voltage, $V_B$, comprises low-pass filter 46 arranged similar to filter 21 in FIG. 1 for providing a relatively low impedance path for D.C. signals and a relatively high impedance path for microwave signals.

As an example of oscillator 29 operation, a suitable reverse D.C. bias signal of 141 volts is coupled to terminal 53 of bias filter 46 and thus to cathode 39 of a 0.020 inch diameter silicon avalanche diode 30 having a breakdown voltage of 140 volts. The reverse D.C. bias signal triggered diode 30 into operating in the Trapatt mode and generating a frequency tunable pulsed output signal of 50 watts peak power tunable over a 1.0 db bandwidth from substantially 2.39 GHz to 2.48 GHz. Oscillator circuit 29 is frequency tunable in response to a D.C. magnetic field induced in substrate 31 by a 2.8 ampere current signal coupled to terminal 61 of coil 45. Oscillator 29 is tunable at a rate of substantially 4.0 MHz per oersted when the magnitude of the applied D.C. magnetic field is less than 20 oersteds and 0.2 MHz per oersted when the magnitude of the applied D.C. magnetic field exceeds 20 oersteds. The relative dielectric constant of ferrite substrate 31 is 15.0 and the thickness, $t$, of substrate 31 is 0.050 inches.

Figure 3:
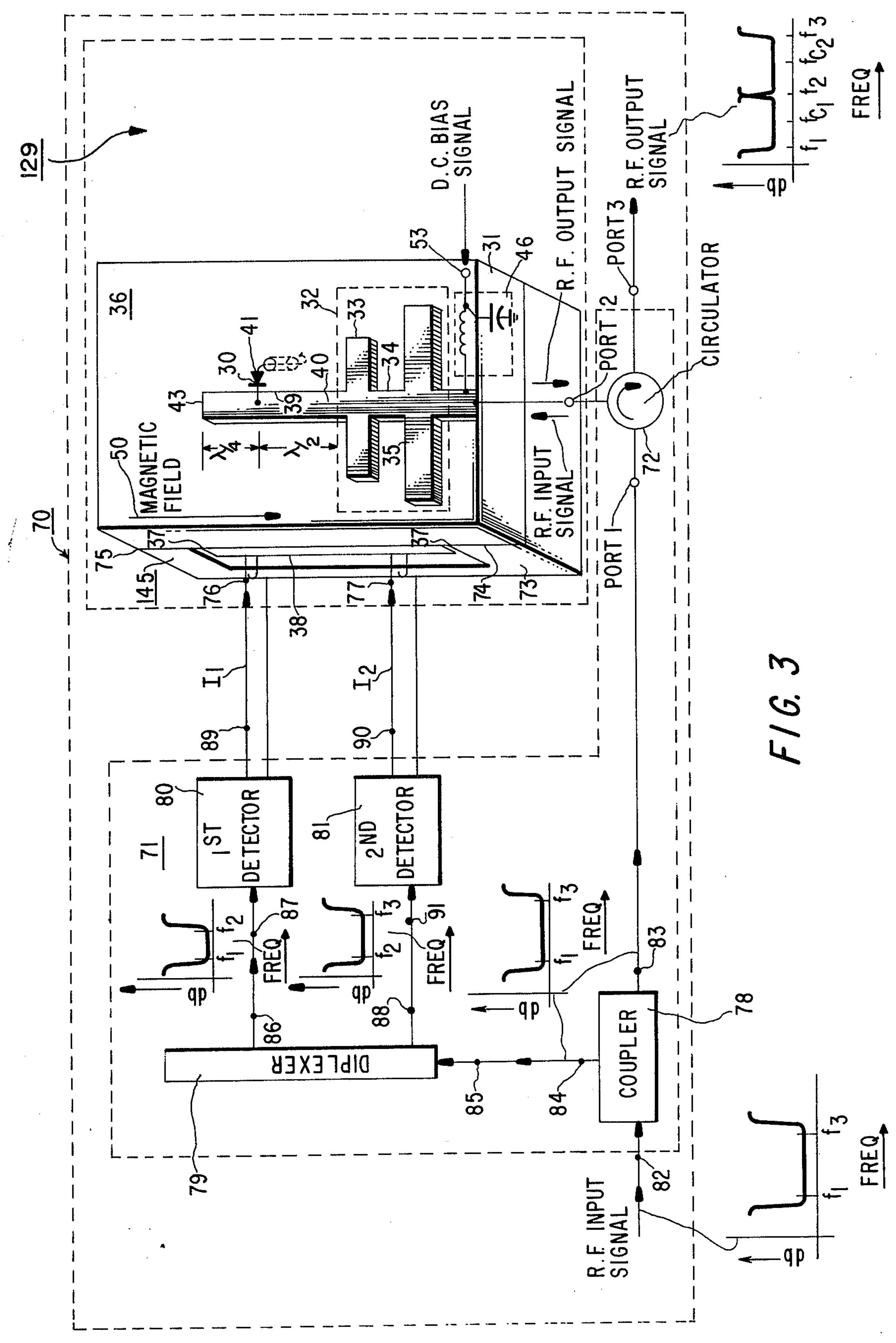
FIG. 3 is a block diagram of a tunable microwave amplifier according to the invention.

Referring to FIG. 3, there is shown a block diagram of a tunable microwave amplifier 70, according to the invention. Amplifier 70 comprises directional coupler 78, diplexer 79, detectors 80 and 81, transmission line circuit 129 and circulator 72. Included in FIG. 3, is an isometric view of microstrip transmission line circuit 129 having strip-like conductors on surface 36 of ferrite substrate 31 for providing the boundary conditions necessary for the Trapatt mode of avalanche diode 30 operation. Microstrip circuit 129 is arranged similar to circuit 29 of FIG. 2. Thus, reference numerals identifying strip-like conductors and circuits in FIG. 2, are used to identify like strip-like conductors and circuits in FIG. 3. In particular, the described functions provided by conductors 42 and 40 and circuits 32 and 46 in FIG. 2, are provided by conductors 42 and 40 and circuits 32 and 46 in FIG. 3.

As described above, diode 30 is capable of being triggered into operation by a combination of a reverse D.C. bias voltage having a magnitude not exceeding breakdown voltage $V_B$, and an input microwave signal coupled to diode 30 from a source, not shown, provided the combined voltage has a magnitude exceeding diode breakdown voltage $V_B$. Means for coupling a suitable D.C. reverse bias signal to diode 30 include the low-pass filter bias circuit 46 described in FIG. 2. Means for coupling a suitable microwave signal to diode 30 include circulator 72 having port 2 connected to low-pass filter circuit 32. Circulator 72 is a prior art device arranged to provide a first non-reciprocal path for microwave signals from port 1 to port 2. Under operating conditions, properly biased avalanche diode 30 and associated microwave circuitry 129 is arranged to amplify the microwave input signal. However, the instantaneous bandwidth of amplifier 70 is relatively narrow compared to the operating bandwidth of amplifier 70. As an example, amplifier 70 is responsive to input microwave signals from $f_1$ to $f_3$ and is operable over a first relatively narrow instantaneous bandwidth from $f_1$ to $f_2$ and a second relatively narrow instantaneous bandwith from $f_2$ to $f_3$. Thus, amplifier 70 has an overall operating bandwidth from $f_1$ to $f_3$, as shown in the attenuation (db) vs. frequencies plot in FIG. 3.

Diode generated output signals within an instantaneous bandwidth centered at a desired output frequency (either $f_c$ or $f_c$ ) are transmitted through low-pass filter 32 to circulator port 2. It should be noted that the output signal generated by diode 30 may be at the same frequency as the input microwave signal or at a desired harmonic thereof. Circulator 72 is arranged to provide a second non-reciprocal path for microwave signals from port 2 to a load impedance, not shown, terminating circulator port 3.

As described above in conjunction with FIG. 2, the operating frequency of diode 30 is varied in response to a variable magnitude longitudinal D.C. magnetic field coupled to substrate 31 in the direction of microwave signal propagation. Accordingly, a first magnitude of D.C. magnetic field tunes circuit 129, in a manner as described for FIG. 2, to permit diode 30 operation over a first instantaneous bandwidth from $f_1$ to $f_2$ and centered at $f_{c_1}$. A second magnitude of D.C. magnetic field tunes circuit 129 to permit diode 30 operation over a second instantaneous bandwidth from $f_2$ to $f_3$ and centered at $f_{c_2}$. Means for providing a variable magnitude D.C. magnetic field include an electromagnet 145 having a horseshoe shaped ferromagnetic material 73 with ends 74 and 75 touching substrate surface 37 and wire coils 76 and 77 encircling material 73. A D.C. current signal, $I_1$, coupled to coil 76 induces a first longitudinal D.C. magnetic field in substrate 31. The magnitude, $H_1$, of the first D.C. magnetic field is suitable for tuning circuit 129 to permit diode 30 operation over a first instananeous bandwidth from $f_1$ to $f_2$ and centered at $f_{c_1}$. A D.C. current signal, $I_2$, coupled to coil 77 induces a second longitudinal D.C. magnetic field in substrate 31. The magnitude, $H_2$, of the second D.C. magnetic field is suitable for tuning circuit 129 to permit diode 30 operation over a second instantaneous bandwidth from $f_2$ to $f_3$ and centered at $f_{c_2}$. A plot of operating frequency response of amplifier 70 is illustrated at the bottom of FIG. 3.

Means for providing current signals $I_1$ and $I_2$ to coils 76 and 77, respectively, comprise directional coupler 78, diplexer 79, first detector 80 and second detector 81. Coupler 78 is a prior art device arranged to sample or couple a predetermined portion of a microwave or R.F. input signal coupled to coupler input terminal 82 and transmit the remainder of the R.F. input signal to circulator port 1 coupled to coupler output terminal 83. The sampled or coupled portion of the microwave input signal is transmitted from coupler output terminal 84 to diplexer input terminal 85. An example of directional coupler 78 is described in detail in Chapter 13 of "Microwave Filters, Impedance-Matching Networks, And Coupling Structures" by Matthaei et al. published by McGraw-Hill, Inc.

Diplexer 79 is an arrangement of filters connected in parallel or in series for splitting or separating a signal, having a relatively wide band of frequencies, $f_1$ to $f_3$, e.g. one to three GHz, coupled to diplexer input terminal 85, into two relatively narrower bands of frequencies, $f_1$ to $f_2$ and $f_2$ to $f_3$ respectively. Signals within the frequency band $f_1$ to $f_2$ are transmitted from diplexer output terminal 86 to first detector input terminal 87. Signals within the frequency band $f_2$ to $f_3$ are transmitted from diplexer output terminal 88 to second detector input terminal 91. An example of diplexer 79 is further described in Chapter 16 of "Microwave Filters, Impedance-Matching Networks, And Coupling Structures," supra.

First detector 80 is arranged, as known in the prior art, to convert microwave signals, within the frequency band, $f_1$ to $f_2$, to a D.C. current signal having magnitude $I_1$ and to transmit $I_1$ from detector 80 output terminal 89 to coil 76. Second detector 81 is arranged, similarly, to convert microwave signals within the frequency band $f_2$ to $f_3$ to a D.C. current signal having magnitude $I_2$ and to transmit $I_2$ from detector 81 output terminal 90 to coil 77. Thus, circuit 71 is arranged to induce in ferrite substrate 31, a magnitude of D.C. magnetic field which is determined by the frequency of the input microwave signal. The magnitude of the induced D.C. magnetic field tunes circuit 129 to permit diode 30 operation over a relatively wide frequency bandwidth from $f_1$ to $f_3$.

In summary, the frequency of an output signal generated by an avalanche diode 30 operating in the Trapatt mode is varied automatically according to the invention in response to a variable magnitude D.C. magnetic field. The avalanche diode 30 is included as part of an appropriate microstrip circuit, 29 or 129, arranged on a ferrite substrate. The D.C. magnetic field is coupled to ferrite substrate 31 in the direction of microwave propagation. The magnitude of the substrate's magnetic permeability, $\mu$, is variable in response to the magnitude of the coupled D.C. magnetic field. A change in the magnitude of the coupled D.C. magnetic field tunes the frequency determining electrical length, $\gamma/2$, of conductor 40 and the impedance presented by microwave circuit 29 and 129 which enables diode 30 operation in the Trapatt mode at a desired frequency.

A preferred embodiment of the invention using a low-pass filter for impedance matching and frequency selection has been shown and described. Various other embodiments and modifications thereof will be apparent to those skilled in the art, such as using a band-pass or high-pass filter for impedance matching and frequency selection and will fall within the scope of the invention as defined in the following claims.

What is claimed is:

1. Apparatus comprising:

an active element having at least two input terminals and exhibiting a current-voltage characteristic including a negative resistance portion for causing said element to operate in a Trapatt mode in response to a bias signal exceeding a predetermined threshold magnitude;

a transmission line circuit on a ferrite substrate including said element operating in said Trapatt mode and generating signals at a desired frequency during periods when said bias signal exceeds said predetermined threshold magnitude, said transmission line circuit having a first magnetically tunable portion determining said desired frequency and a second portion having a magnetically tunable impedance for operating said element in said Trapatt mode.

2. Apparatus according to claim 1, further comprising:

means for coupling a D.C. bias signal to said element, said D.C. bias signal having a magnitude exceeding said predetermined threshold magnitude, whereby said element is triggered into operating in said Trapatt mode.

3. Apparatus according to claim 1, further comprising:

means for coupling to said element a combination of a D.C. bias signal having a magnitude less than said predetermined threshold magnitude and a microwave signal, said combination of D.C. and microwave signals having a magnitude exceeding said predetermined threshold magnitude, whereby said element is triggered into operating in said Trapatt mode.

4. Apparatus according to claim 1, further comprising:

means for coupling to said ferrite substrate a longitudinal D.C. magnetic field.

5. Apparatus according to claim 4, wherein said D.C. magnetic field coupling means is a coil wound around said ferrite substrate for inducing in said ferrite substrate said longitudinal D.C. magnetic field in response to a current signal coupled to said coil.

6. Apparatus according to claim 4, wherein said D.C. magnetic field coupling means is an electromagnet.

7. Apparatus according to claim 1, wherein said transmission line circuit is a low-pass filter separated from said element by a conductor having an electrical length of $\gamma/2$, where $\gamma$ is transmission line wavelength at said desired frequency, said filter having a pass-band including said desired frequency and a stopband for reflecting element generated signals at frequencies harmonically related to said desired frequency.

* * * * *